(12) United States Patent
Natsume

(10) Patent No.: US 7,188,285 B2
(45) Date of Patent: Mar. 6, 2007

(54) SCAN TEST CIRCUIT WITH RESET CONTROL CIRCUIT

(75) Inventor: Kenichi Natsume, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 501 days.

(21) Appl. No.: 10/674,378

(22) Filed: Oct. 1, 2003

(65) Prior Publication Data

US 2004/0111658 A1    Jun. 10, 2004

(30) Foreign Application Priority Data

Dec. 5, 2002    (JP) ............... 2002-353702

(51) Int. Cl.
*G01R 31/28* (2006.01)
(52) U.S. Cl. ..................... 714/727; 714/729
(58) Field of Classification Search ............... 714/726, 714/30, 738, 727, 729; 365/201; 327/200
See application file for complete search history.

(56) References Cited

U.S. PATENT DOCUMENTS 5,815,512 A  *  9/1998  Osawa et al. ............... 714/726
5,911,039 A  *  6/1999  Hashizume et al. .......... 714/30
5,946,247 A  *  8/1999  Osawa et al. ................ 365/201
5,973,529 A  * 10/1999  Chappell et al. ............. 327/200
6,079,039 A  *  6/2000  Nakamura ................... 714/726
6,886,124 B2 * 4/2005  Wang .......................... 714/738

FOREIGN PATENT DOCUMENTS

| JP | 59142481 A  | 8/1984  |
| JP | 2001196539 A | 7/2001  |
| JP | 2001-296331 | 10/2001 |
| JP | 2002-267719 | 9/2002  |

* cited by examiner

*Primary Examiner*—David Ton
(74) *Attorney, Agent, or Firm*—Volentine & Whitt, P.L.L.C.

(57) ABSTRACT

A scan test circuit includes a scan flip-flop that receives a reset signal, a data signal, a scan data signal, and a scan shift enable signal selecting either the data signal or the scan data signal. A reset control circuit controls the reset signal according to the scan shift enable signal. Even if the reset signal originates in a combinatorial circuit, the reset control circuit can prevent the flip-flop from being reset during a scan shift sequence, without the need for external control of the reset signal. Further control of the reset signal can be provided by a mask circuit. These reset control features enable improved fault coverage to be obtained with a reduced number of external input terminals, a reduced number of test patterns, and only a small amount of additional test circuitry.

10 Claims, 11 Drawing Sheets

FIG.3

| a | b | y | RST | FLIP-FLOP 100 | SA0 FAULT AT PIN a OF BUFFER 111 |
|---|---|---|---|---|---|
| 0 | 0 | 0 | 0 | NOT RESET | NOT TESTABLE |
| 0 | 1 | 0 | 0 | NOT RESET | NOT TESTABLE |
| 1 | 0 | 0 | 0 | NOT RESET | TESTABLE |
| 1 | 1 | 1 | 1 | RESET | NOT TESTABLE (BECAUSE RESET) |

FIG.7

| a | b | y | ORO | RST | FLIP-FLOP 200 OR 300 | SA0 FAULT AT PIN a OF BUFFER 111 |
|---|---|---|---|---|---|---|
| 0 | 0 | 0 | 0 | 0 | NOT RESET | NOT TESTABLE |
| 0 | 1 | 0 | 0 | 0 | NOT RESET | NOT TESTABLE |
| 1 | 0 | 0 | 0 | 0 | NOT RESET | TESTABLE |
| 1 | 1 | 1 | 0 | 1 | RESET | NOT TESTABLE (BECAUSE RESET) |
| 0 | 0 | 0 | 1 | 0 | NOT RESET | NOT TESTABLE |
| 0 | 1 | 0 | 1 | 0 | NOT RESET | NOT TESTABLE |
| 1 | 0 | 0 | 1 | 0 | NOT RESET | TESTABLE |
| 1 | 1 | 1 | 1 | 0 | NOT RESET | TESTABLE |

ABSTRACT# SCAN TEST CIRCUIT WITH RESET CONTROL CIRCUIT

BACKGROUND OF THE INVENTION

1. Field of the Invention

The present invention relates to a scan test circuit that, when incorporated into an integrated circuit, provides improved fault coverage while reducing the necessary amount of test circuitry. More particularly, the invention relates to the resetting of flip-flops in a scan test circuit.

2. Description of the Related Art

Scan test circuits include scan flip-flops equipped with multiplexers that can select either normal data input or scan data input. A plurality of such scan flip-flops may be chained to operate as a shift register. Arbitrary test data can be loaded into a chain of scan flip-flops in a scan shift sequence, and output to a combinatorial circuit. The scan shift sequence is followed by a capture sequence in which further scan flip-flops (or the same flip-flops) latch data output from the combinatorial circuit, thereby determining how the combinatorial circuit processed the test data.

A challenge faced in scan testing is designing test data to provide high fault coverage, that is, to detect a high percentage of anticipated faults in the combinatorial circuit. The challenge is made more difficult by the presence of flip-flops, not synchronized with the scan flip-flops, that may conceal the operation of combinatorial circuit elements during a scan test. Japanese Unexamined Patent Application Publication No. 2001-296331 discloses a scan test circuit having a test enable input signal that enables such flip-flops to be bypassed. Japanese Unexamined Patent Application Publication No. 2002-267719 discloses a scan test circuit having special scan control flip-flops or exclusive-OR gates that increase the number of points at which signals output from the combinatorial circuits can be observed.

The scan flip-flops may also have asynchronous reset terminals, which pose a further challenge during the scan test process. Some scan test circuits generate an internal reset signal, which must be held in the inactive state during the scan shift sequence. Some of these scan test circuits also receive an external reset signal which is selected and held inactive during the scan shift sequence, and may be controlled arbitrarily for test purposes during the scan capture sequence.

A general problem with many known scan test circuits is that an integrated circuit incorporating them requires extra pins for input of signals such as the external reset signal, the test enable signal, or other test mode signals. By increasing the necessary number of test patterns, these extra pins increase the cost of scan testing. The extra pins also increase the size and fabrication cost of the integrated circuit, and the added circuitry they entail leads to lowered fault coverage and lower reliability. The same is true of scan test circuits with special scan control flip-flops or extra exclusive-OR gates.

SUMMARY OF THE INVENTION

An object of the present invention is to provide a test scan circuit that reduces the number of external terminals required by an integrated circuit into which the scan test circuit is incorporated.

Another object of the invention is to reduce the required number of test patterns.

Yet another object is to improve fault coverage.

Still another object is to reduce the size of the circuitry associated with the scan test.

The invented scan test circuit includes a flip-flop that receives a reset signal, a data signal, a scan data signal, and a scan shift enable signal, selects the data signal or the scan data signal according to the scan shift enable signal, provides the selected signal as an output data signal, and sets the output data signal to a predetermined state when the reset signal is active.

The scan test circuit also includes a reset control circuit for controlling the reset signal according to the scan shift enable signal. Preferably, the reset control circuit controls the reset signal so that the reset signal is enabled only during a scan capture sequence. The reset signal is thus enabled when the scan shift enable signal selects the data signal and is disabled when the scan shift enable signal selects the scan data signal.

The reset signal may originate in a combinatorial circuit, in which case the reset control circuit may comprise a logic gate that performs a logic operation on the scan shift enable signal and a signal output from the combinatorial circuit.

The scan test circuit may also include a mask circuit for masking the reset signal according to, for example, arbitrary data loaded into a flip-flop, or arbitrary data input at an input terminal.

The number of external terminals required by an integrated circuit including the invented scan test circuit can be reduced because the invented scan test circuit does not require an external terminal for input of a reset signal, or for input of signals such as a test mode signal.

The number of test patterns required can be reduced for the same reason, particularly if a mask circuit is provided so that the reset signal can be masked regardless of the output of the combinatorial circuit.

Fault coverage can be improved because the reset function can be tested under easily controlled conditions.

The size of the circuitry associated with the scan test can be reduced because the additional circuitry necessary to control and test the reset function (the reset control circuit, or the reset control circuit and mask circuit) can be implemented with a small number of logic gates.

BRIEF DESCRIPTION OF THE DRAWINGS

In the attached drawings:

FIG. 3 is a table illustrating states of the combinatorial circuit in FIG. 2;

FIG. 7 is a table illustrating states of the combinatorial circuit in FIG. 6;

DETAILED DESCRIPTION OF THE INVENTION

Figure 1:
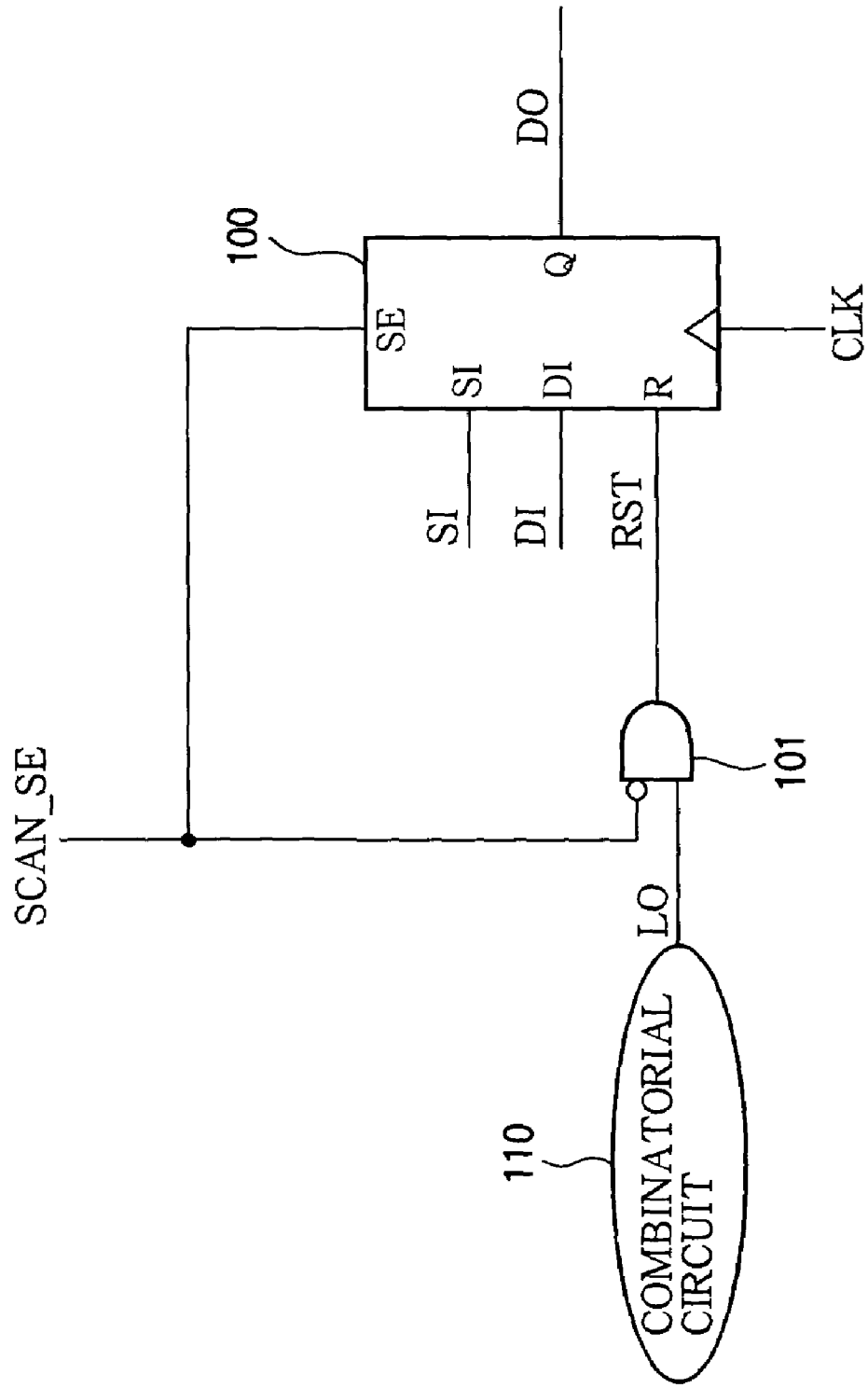
FIG. 1 is a circuit diagram showing part of a scan test circuit according to a first embodiment of the invention.

Embodiments of the invention will now be described with reference to the attached drawings, in which like elements are indicated by like reference characters.

First Embodiment

Referring to FIG. 1, the first embodiment provides a scan test circuit comprising a flip-flop 100, an AND gate 101, and a combinatorial circuit 110. The flip-flop 100 has a scan shift enable input terminal SE for input of a scan shift enable signal SCAN_SE, a scan data input terminal SI for input of scan data SI, and a data input terminal DI for input of data DI. The scan data SI may be received from another flip-flop (not shown) in the scan test circuit. Data DI may be received from any type of circuit.

The flip-flop 100 also has an output terminal Q for output of data DO, and a clock terminal for input of a clock signal CLK. The output terminal Q may be connected to the scan data input terminal of another flip-flop (not shown) in the scan test circuit. During a scan test, the clock signal CLK functions as a scan clock.

The flip-flop 100 further has an asynchronous, positive-logic reset input terminal R for input of a reset signal RST. The reset signal RST is output from the AND gate 101, which functions as the reset control circuit. The AND gate 101 has a positive-logic (non-inverting) input terminal for input of logic output data LO from the combinatorial circuit 110, and a negative-logic (inverting) input terminal for input of the scan shift enable signal SCAN_SE. The logic output data signal LO functions as a reset control signal. This signal LO would conventionally be input directly to the reset input terminal of flip-flop 100, but in the present embodiment it first passes through the reset control circuit or AND gate 101.

Next, an example of a scan test circuit including the circuit in FIG. 1 will be described with reference to FIG. 2. The scan test circuit 10 includes the flip-flop 100, AND gate 101, and combinatorial circuit 110 described above, additional flip-flops 120 and 130 (second and third flip-flops), and-buffers 111 and 112.

The scan shift enable input terminal SE of flip-flop 100 receives the scan shift enable signal SCAN_SE from an external source. The scan data input terminal SI of flip-flop 100 receives scan data SI from the output terminal of flip-flop 120, so that in a scan shift operation, scan data are shifted from flip-flop 120 to flip-flop 100. The data input terminal DI of flip-flop 100 receives data DI from buffer 111, which amplifies the data output from the output terminal of flip-flop 120.

The output terminal Q of flip-flop 100 is connected to the scan data input terminal of another flip-flop (not shown) in the scan test circuit, which receives the data DO output from flip-flop 100 as scan input data in synchronization with the scan clock signal CLK.

Since the asynchronous reset input terminal of flip-flop 100 is connected to the output terminal of the AND gate 101, a reset occurs when the scan shift enable signal SCAN_SE is at the low logic level and the reset control signal LO (denoted y in FIG. 2) is at the high logic level.

Figure 2:
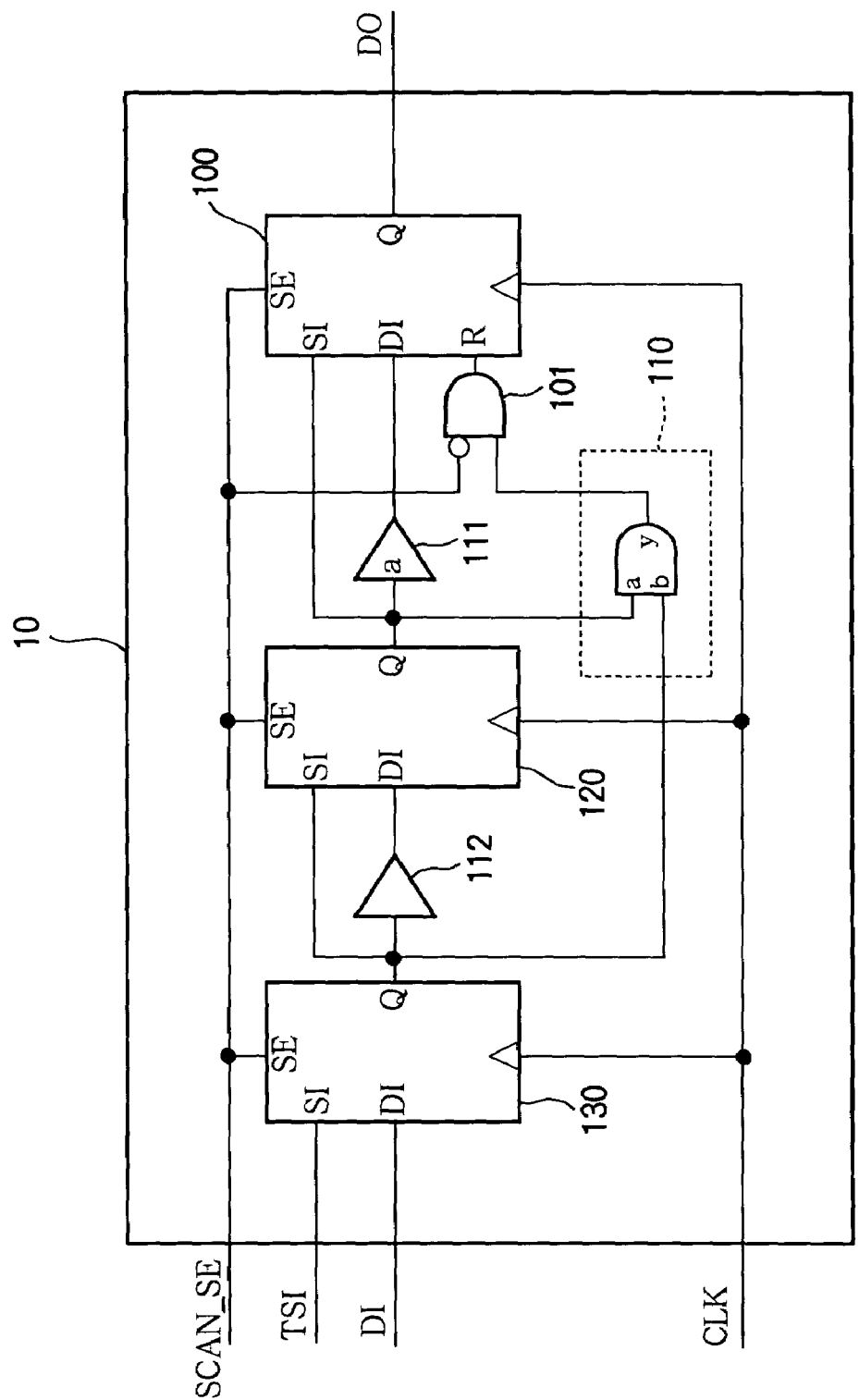
FIG. 2 is a circuit diagram showing an example of the overall structure of the scan test circuit according to the first embodiment.

For simplicity, the combinatorial circuit 110 in FIG. 2 is a single two-input AND gate. The two inputs (a and b) are the output signals of flip-flops 120 and 130. The combinatorial circuit is not limited to the configuration shown in FIG. 2, but in this particular configuration, when the scan shift enable signal goes low (SCAN_SE=0) after completion of a scan sequence, the output (y) of the combinatorial circuit, the level of the reset signal RST, the state (reset or not reset) of flip-flop 100, and the testability of buffer 111 for a stuck-at-0 (SA0) fault depend on the output (a) of flip-flop 120 (the input-signal to buffer 111) and the output (b) of flip-flop 130 as indicated in FIG. 3.

Figure 4:
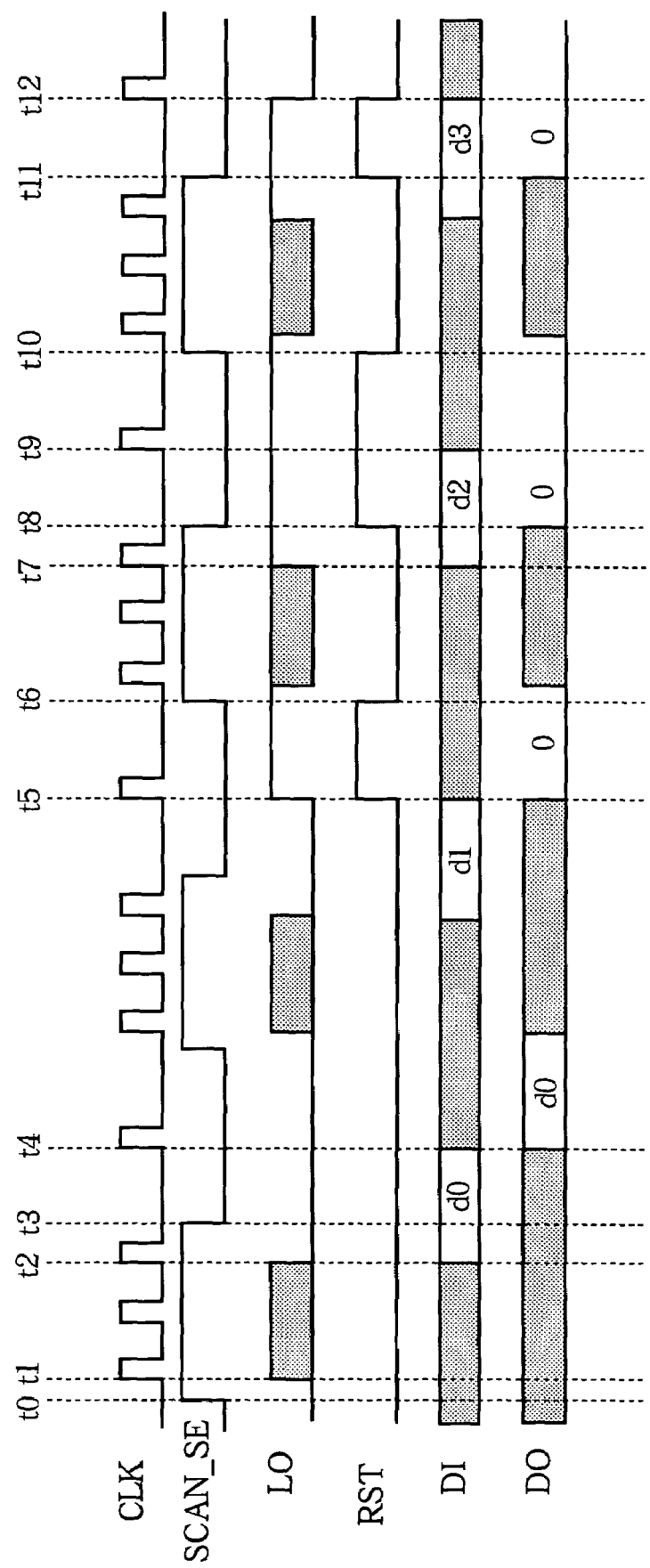
FIG. 4 is a timing waveform diagram illustrating the operation of the first embodiment.

Next, the operation of the scan test circuit 10 will be described with reference to the timing diagram in FIG. 4, which uses the signal names shown in FIG. 1.

At timing t0, the scan shift enable signal goes high (SCAN_SE=1) to start the first scan sequence.

While the scan shift enable signal SCAN_SE is high, scan shifts are performed in synchronization with the clock signal CLK. In this embodiment, the scan chain includes three flip-flops 100, 120, 130, so there are three clock pulses in the scan sequence, the first occurring at timing t1 and the third at timing t2. The first scan shift sequence ends when the scan shift enable signal goes low at timing t3. (The present invention is of course not limited to scan sequences with just three clock pulses, or any other specific number of clock pulses.)

The test data scanned in during the first scan shift sequence are designed so that when the last scan shift in the sequence is completed at timing t2, the output of the combinatorial circuit 110 is low (LO=0). Accordingly, flip-flop 100 is not reset. At this point, flip-flop 100 receives data d0 from buffer 111. The value of d0 and the LO, DI, and DO values indicated by shading in FIG. 4 may be either '1' or '0'.

At timing t4, a first capture sequence is started. Since the data DI input to flip-flop 100 is d0, flip-flop 100 captures this value (d0) at a rising edge of the clock signal CLK, at which point the output data DO of flip-flop 100 becomes d0. The data scanned in during the first scan shift sequence are designed so that the output LO of the combinatorial circuit and therefore the reset signal RST remain low. Next, the scan shift enable signal SCAN_SE is driven high and the captured data are scanned out, while new test data are scanned in. Since the scan shift enable signal SCAN_SE is inverted at the input terminal of AND gate 101, the RST signal remains inactive during this scan shift sequence, thereby preventing the shifted data from being reset. The operation of buffer 111 can be confirmed by verifying that the expected d0 value is scanned out.

Similar scan shift and capture sequences now continue. At timing t5, flip-flops 120 and 130 capture data that make the output of the combinatorial circuit 110 go high (LO=1), so the output of AND gate 101 goes high (RST=1), resetting the output of flip-flop 100 (DO=0).

This reset is cleared when the scan shift enable signal goes high (SCAN_SE=1) at timing t6 to start the next scan shift sequence, forcing the output of AND gate 101 to go low (RST=0).

The test data in this next scan shift sequence bring the output of the combinatorial circuit 110 to the high state (LO=1) at the rising edge of the last clock (CLK) pulse at timing t7. Accordingly, when the scan shift enable signal goes low (SCAN_SE=0) at timing t8, the output of AND gate 101 goes high (RST=1), resetting the output of flip-flop 100 (DO=0).

If the data captured by flip-flop 130 at timing t9 are also high, the output of the combinatorial circuit 110 remains high (LO=1), so the output of AND gate 101 remains high (RST=1) during the interval from t9 to t10 while the scan shift enable signal remains low (SCAN_SE=0), and the output of flip-flop 100 is held in the reset state (DO=0).

Similar test data are scanned in during the next scan shift sequence, so that the output of AND gate 101 goes high (RST=1) at timing t11 for the same reason as at timing t8, resetting the output of flip-flop 100 (DO=0). This time, however, the output of the combinatorial circuit 110 goes low (LO=0) in the capture sequence at timing t12, forcing the output of AND gate 101 to go low (RST=0) and clearing the reset.

As described above, the asynchronous reset signal is kept inactive during each scan shift sequence, so that scan shifting can be performed without resetting the shifted data, but the asynchronous reset signal can be manipulated in various ways by the output LO of the combinatorial circuit 110 during the capture sequence, enabling the reset/nonreset state of flip-flop 100 to be tested.

These manipulations require no extra scan test pins for input of signals such as a scan test mode signal or an external reset signal. Thus, the integrated circuit being tested requires fewer pins than would be necessary for a conventional scan test circuit having an asynchronous reset signal. Moreover, the addition of one AND gate 101 enables the reset circuit of flip-flop 100 to be tested under controlled conditions. Thus, fault coverage by scan testing can be improved at a reduced cost in terms of scan test circuitry size.

Second Embodiment

Figure 5:
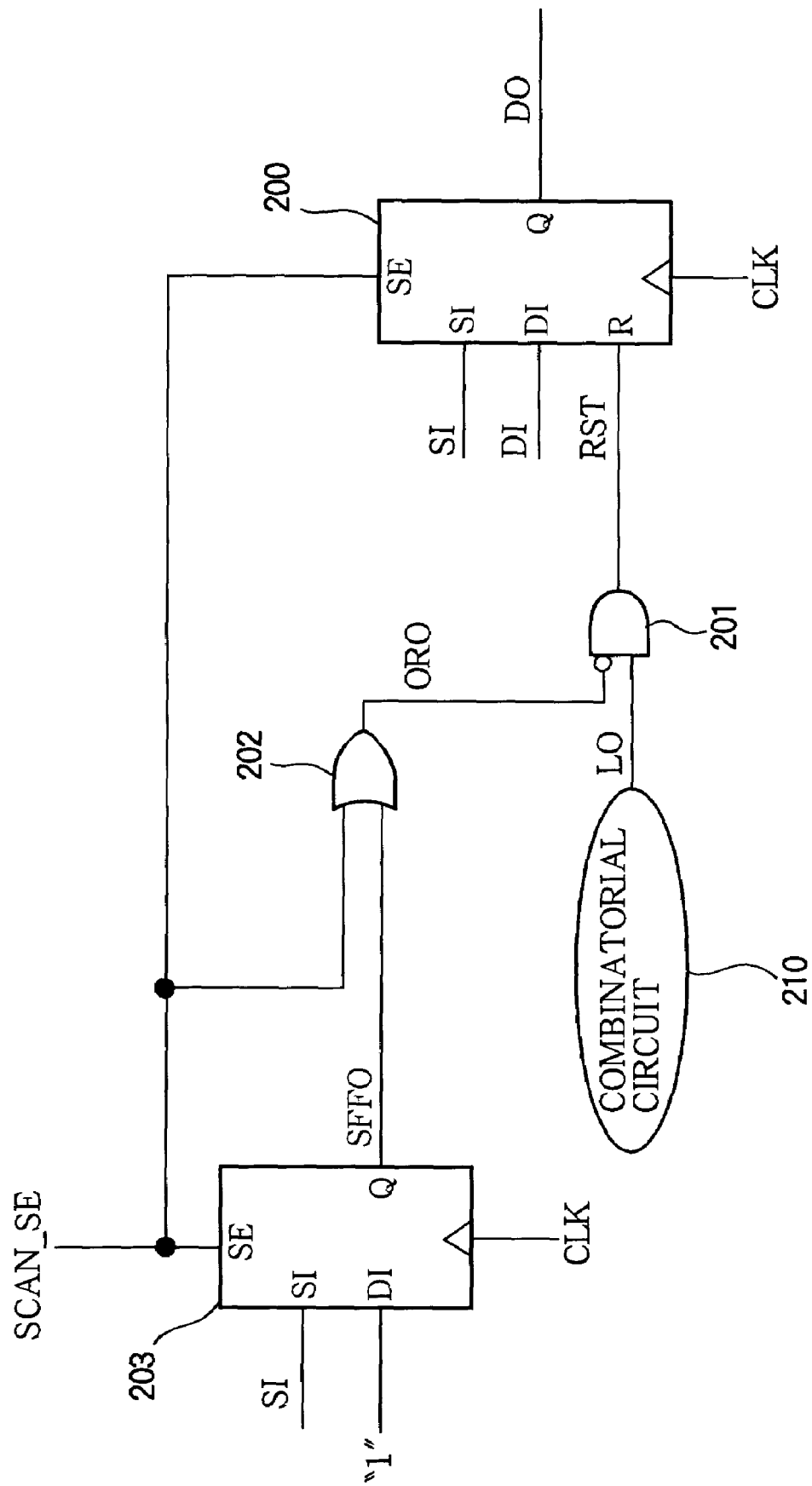
FIG. 5 is a circuit diagram showing part of a scan test circuit according to a second embodiment of the invention.

Next, a scan test circuit according to a second embodiment will be described with reference to FIG. 5. The scan test circuit in this embodiment includes an asynchronous reset flip-flop 200, an AND gate 201, a combinatorial circuit 210, an OR gate 202, and a scan flip-flop 203 for loading of arbitrary data.

Flip-flop 200 is similar to scan flip-flop 100 in the first embodiment, having a scan shift enable input terminal SE for input of the scan shift enable signal SCAN_SE, a scan data input terminal SI for input of scan data SI, and a data input terminal DI for input of data DI. The scan data SI may be received from scan flip-flop 203 or another scan flip-flop (not shown). The data DI may be received from any type of circuit.

This flip-flop 200 also has an output terminal Q for output of data DO, and a clock terminal for input of the clock signal CLK. The output terminal Q may be connected to the scan data input terminal of yet another flip-flop (not shown) in the scan test circuit. During a scan test, the clock signal CLK functions as the scan clock.

As in the first embodiment, flip-flop 200 has an asynchronous, positive-logic reset input terminal R for input of a reset signal RST output from the AND gate 201 with positive- and negative-logic input terminals. The positive-logic input terminal of the AND gate 201 receives logic output data LO (the reset control signal) from the combinatorial circuit 210; the negative-logic input terminal receives the output signal ORO of the OR gate 202.

The OR gate 202 receives the output SFFO of scan flip-flop 203 and the scan shift enable signal SCAN_SE. It is possible for the data input terminal DI of flip-flop 203 to receive the output of an exclusive logical OR circuit or an arbitrary combinatorial circuit, thereby improving scan observability, but in this embodiment, for explanatory purposes, the data input terminal DI of scan flip-flop 203 is tied to the high logic level ('1').

The clock terminal of scan flip-flop 203 receives the clock signal CLK that functions as the scan clock during a scan test.

Next, an example of a scan test circuit including the circuit in FIG. 5 will be described with reference to FIG. 6. The scan test circuit 20 includes the flip-flop 200, AND gate 201, combinatorial circuit 210, OR gate 202, and scan flip-flop 203 described above, an additional scan flip-flop 230, and a buffer 211.

The scan shift enable input terminal SE of flip-flop 200 receives the scan shift enable signal SCAN_SE from an external source. The scan data input terminal SI of flip-flop 200 receives scan data SI from the output terminal of flip-flop 203, so that in a scan sequence, scan data are shifted from flip-flop 203 to flip-flop 200. The data input terminal DI of flip-flop 200 receives data DI from buffer 211, which amplifies the data (a) output from flip-flop 230.

The output terminal Q of flip-flop 200 is connected to the scan data input terminal of another scan flip-flop (not shown) in the scan test circuit, so that the data DO output from flip-flop 200 can be scanned out by the clock signal CLK during a scan test.

The asynchronous reset input terminal of flip-flop 200 is connected directly to the output terminal of the AND gate 201. A reset occurs when the reset signal RST goes high, that is, when the output signal LO of the combinatorial circuit 210 is at the high logic level and the output signal ORO of the OR gate 202 is at the low logic level.

As pointed out above, the OR gate 202 receives the output SFFO of scan flip-flop 203 and the scan shift enable signal SCAN_SE. The OR gate 202 functions as a mask circuit that modifies the scan shift enable signal SCAN_SE according to the output SFFO of scan flip-flop 203, and supplies the modified scan shift enable signal to the reset control circuit 201. In the present embodiment, for simplicity of description, scan flip-flop 203 is part of the same scan chain as scan flip-flops 203 and 200 and therefore receives the same clock signal CLK, although this need not be true in general.

Figure 6:
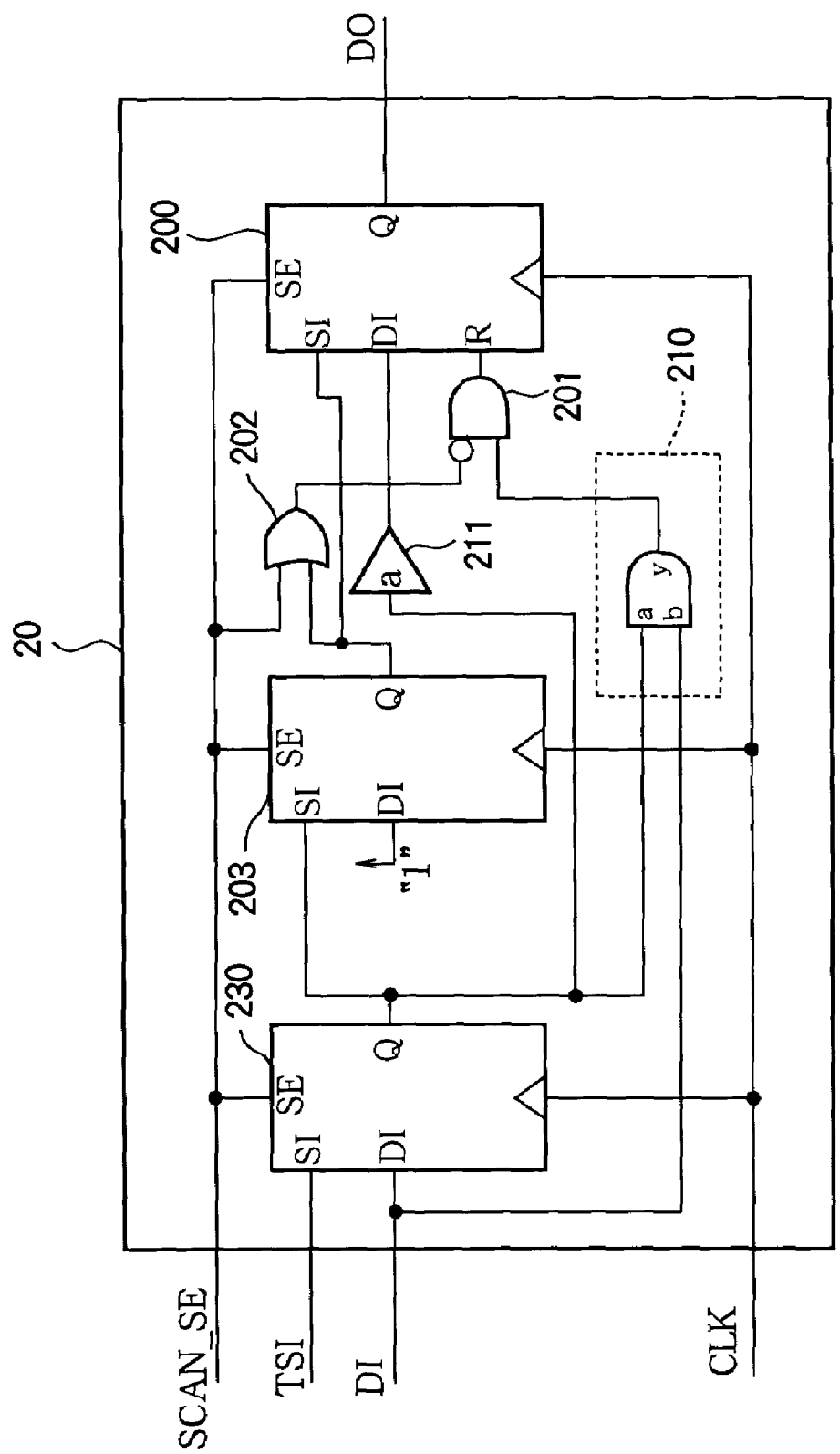
FIG. 6 is a circuit diagram showing an example of the overall structure of the scan test circuit according to the second embodiment.

The combinatorial circuit 210 in FIG. 6 is a two-input AND gate that receives the output signal of flip-flop 230 and the data DI input to flip-flop 230. The combinatorial circuit is not limited to the configuration shown in FIG. 6, but with this configuration, if the output signal of flip-flop 230 (which is also the input signal to buffer 211) is denoted a and the data DI received by the AND gate in the combinatorial circuit 210 is denoted b, then when the scan shift enable signal goes low (SCAN_SE=0) after completion of a scan sequence, the testability of buffer 211 for a stuck-at-0 (SA0) fault depends on the relationship among signals a and b and the output signal ORO of the OR gate 202 as indicated in FIG. 7. It should be noted that this stuck-at-0 fault can now be tested even when both inputs to the combinatorial circuit 210 are high (that is, when a=b=1), provided ORO is also high. FIG. 7 also indicates the value of the output (y) of the combinatorial circuit 210, the level of the reset signal RST, and the resulting state (reset or not reset) of flip-flop 200.

As shown in FIG. 7, the second embodiment provides a masking function that can mask the reset signal RST and thereby prevent the resetting of flip-flop 200 regardless of the state of the combinatorial circuit 210. This provides an increased versatility that enables test patterns to be compressed and test time reduced.

Test patterns are usually generated by an automatic test pattern generator (ATPG). This software tool eliminates patterns that would duplicate states set by other patterns, and attempts to reduce the required number of test patterns by generating test patterns that, after having been scanned in, allow faults to be detected at as many gates as possible in the following capture sequence. By increasing the testability of buffer 211 for a stuck-at-0 input fault, the masking function provided in this embodiment assists the tool in its task, making it easier for the tool to find a smaller set of test patterns that will detect the targeted faults.

Figure 8:
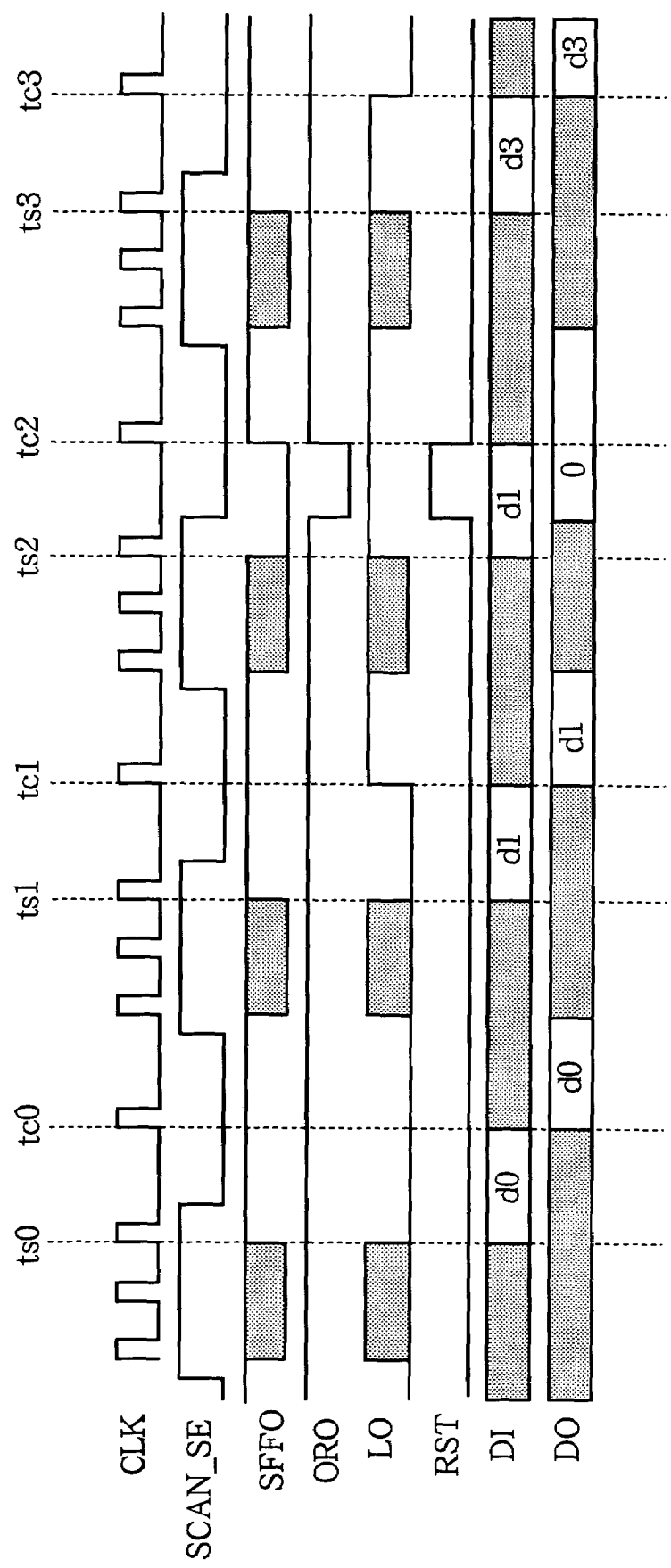
FIG. 8 is a timing waveform diagram illustrating the operation of the second embodiment.

Next, the operation of the scan test circuit 20 in FIG. 6 will be described with reference to the timing diagram in FIG. 8, which uses the signal names shown in FIG. 5. The illustrated scan test sequence is the same as in the first embodiment. The clock signal CLK, scan shift enable signal SCAN_SE, and the output LO of the combinatorial circuit 210 have the same waveforms as in the first embodiment.

During the capture sequence in the first embodiment, the reset signal RST input to flip-flop 100 could only be manipulated by the output LO of the combinatorial circuit 110. In the second embodiment, the reset signal RST input to flip-flop 200 can also be manipulated by the data scanned into scan flip-flop 203 at the last shift timing of a scan shift sequence, and by the data captured by scan flip-flop 203 at the timing immediately after the rising edge of the clock signal in a capture sequence. The scanned-in data are the data loaded into scan flip-flop 203 at timings ts0, ts1, ts2, and ts3 in FIG. 8; these data become the output SFFO of scan flip-flop 203 until respective capture timings tc0, tc1, tc2, or tc3. At each of these capture timings, the output SFFO of scan flip-flop 203 goes high, because the data input terminal DI of scan flip-flop 203 is tied to the high logic level.

In the first scan sequence, the data scanned into scan flip-flops 203 and 230 make the output LO of the combinatorial circuit 210 go low and the output SFFO of scan flip-flop 203 go high at the rising edge of the clock signal CLK at timing ts0. The output ORO of the OR gate 202 is therefore high, and the output signal RST of the AND gate 201 is low.

The data DI input to flip-flop 200 from timing ts0 to timing tc0, denoted d0, are captured by flip-flop 200 at the rising edge of the clock signal CLK at timing tc0. At this point the output DO of flip-flop 200 becomes d0.

In the next scan sequence, at the rising edge of the clock signal CLK at timing ts1, the data scanned into scan flip-flops 203 and 230 once more make the output LO of the combinatorial circuit 210 go low and the output SFFO of scan flip-flop 203 go high. The output ORO of the OR gate 202 remains high and the reset signal RST output from the AND gate 201 remains low.

The data DI (d1) input to flip-flop 200 from timing ts1 to timing tc1 are captured by flip-flop 200 at the rising edge of the clock signal CLK at timing tc1 and output as data DO from flip-flop 200 following timing tc1. The data captured by flip-flop 230 at timing tc1 make the output LO of combinatorial circuit 210 go high, but since the output ORO of the OR gate 202 remains high, the reset signal RST output from the AND gate 201 remains low.

In the next scan sequence, the data scanned into scan flip-flops 203 and 230 make the output LO of the combinatorial circuit 210 go high and the output SFFO of scan flip-flop 203 go low at the rising edge of the clock signal CLK at timing ts2. The output ORO of the OR gate 202 goes low when the scan shift enable signal SCAN_SE goes low (SCAN_SE=0) after timing ts2. When the output ORO of the OR gate 202 is low, the output signal RST of the AND gate 201 is determined by the output LO of the combinatorial circuit 210. If this output LO is high, as shown, the output signal RST of the AND gate 201 goes high, resetting the output of flip-flop 200 (DO=0).

Next, at the rising edge of the clock signal CLK at timing tc2, scan flip-flop 203 captures its data input signal, which is tied to the high logic level. The output SFFO of scan flip-flop 203 therefore goes high, making the output OR of the OR gate 202 go high even though the scan shift enable signal SCAN_SE is low, and forcing the reset signal RST output from AND gate 201 to go low.

In the next scan sequence, the data scanned into scan flip-flops 203 and 230 make the output LO of the combinatorial circuit 210 goes high and the output SFFO of scan flip-flop 203 go high at the rising edge of the clock signal at timing ts3. The output ORO of the OR gate 202 accordingly remains high, and the reset signal RST output from the AND gate 201 remains low.

Since the reset signal RST is low, flip-flop 200 can capture the input data (d3) at its input terminal DI at the rising edge of the clock signal at timing tc3, at which point the output DO of flip-flop 200 becomes d3. The output LO of the combinatorial circuit 210 goes low at this timing, the output ORO of the OR gate 202 remains high, and the output signal RST of the AND gate 201 remains low.

As in the first embodiment, the asynchronous reset signal is kept inactive during the period while the scan shift enable signal SCAN_SE is high during each scan shift sequence, so that scan shifting can be performed without resetting the shifted data, and the asynchronous reset signal can be manipulated in various ways by the output LO of the combinatorial circuit 210 while the scan shift enable signal SCAN_SE is low to test the reset/nonreset state of flip-flop 200. These manipulations can be masked during the capture sequence, however, by the output of scan flip-flop 203, so that the buffer 211 can be tested regardless of the state of the output LO of the combinatorial circuit 210. In FIG. 8, for example, buffer 211 can be tested at timings tc1 and tc3 as well as at timing tc0.

Like the first embodiment, the second embodiment requires no extra scan test pins for input of signals such as a scan test mode signal or an external reset signal. Thus, the integrated circuit being tested requires fewer pins than would be necessary for a conventional scan test circuit having an asynchronous reset signal. Moreover, the addition of the AND gate 201, OR gate 202, and scan flip-flop 203 enables the reset function of flip-flop 200 to be tested, as well as enabling the reset signal to be masked for testing of the circuitry connected to the data input terminal of flip-flop 200. Specifically, the asynchronous reset signal can be enabled or masked by the output from flip-flop 203. The scan test circuitry size can accordingly be reduced, and since scan testing controllability is improved, the necessary number of test patterns can be reduced.

Third Embodiment

Figure 9:
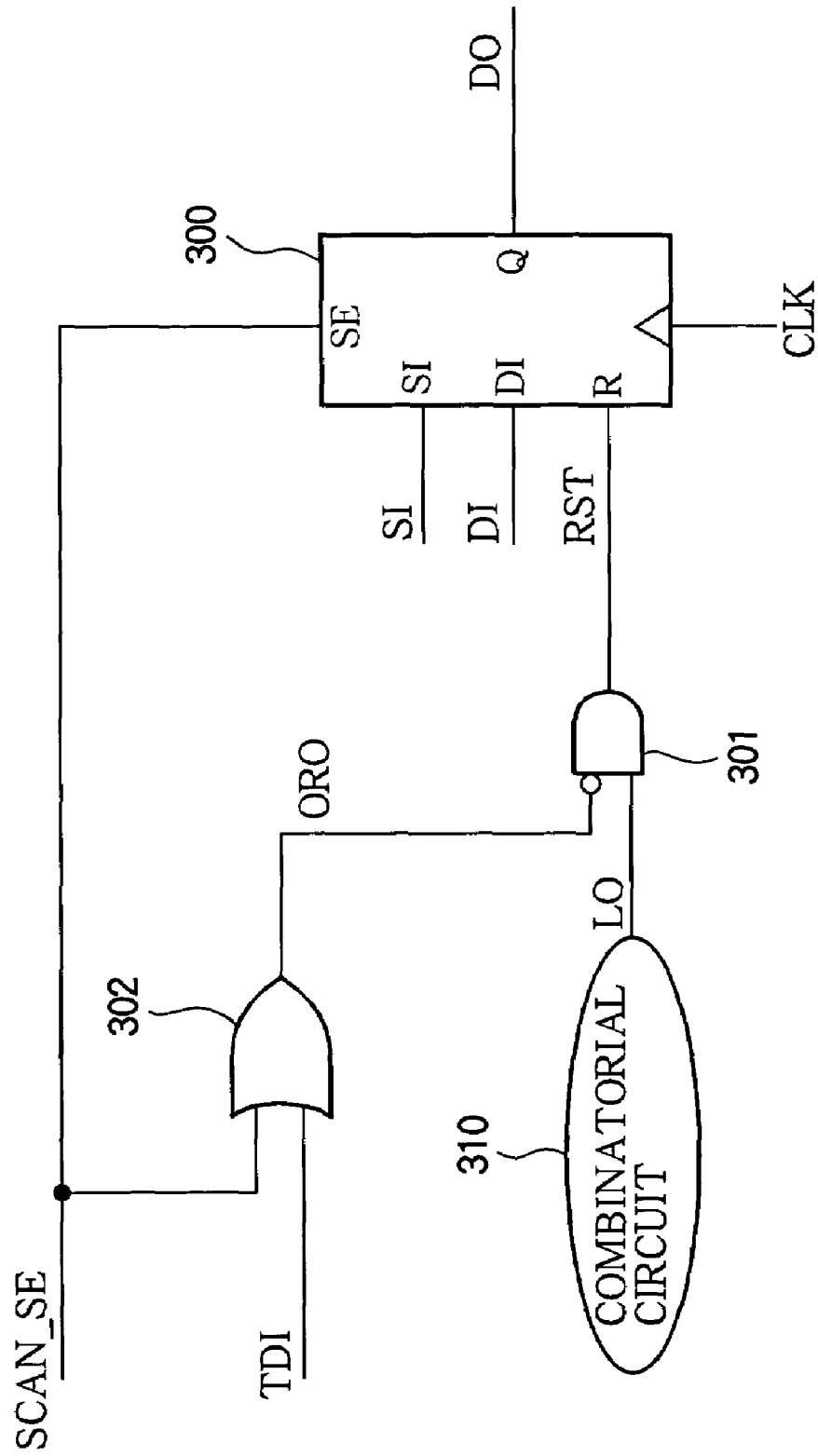
FIG. 9 is a circuit diagram showing part of a scan test circuit according to a third embodiment of the invention.

Next, a scan test circuit according to a third embodiment will be described with reference to FIG. 9. The scan test circuit in this embodiment includes an asynchronous reset flip-flop 300, an AND gate 301, a combinatorial circuit 310, and an OR gate 302.

Flip-flop 300 is similar to scan flip-flop 200 in the second embodiment, having a scan shift enable input terminal SE for input of the scan shift enable signal SCAN_SE, a scan data input terminal SI for input of scan data SI, and a data input terminal DI for input of data DI. The scan data SI may be output from another scan flip-flop (not shown). The data DI may be output from any type of circuit.

This flip-flop 300 also has an output terminal Q for output of data DO, and a clock terminal for input of the clock signal CLK. The output terminal Q may be connected to the scan data input terminal of yet another flip-flop (not shown) in the scan test circuit. During a scan test, the clock signal CLK functions as the scan clock.

As in the second embodiment, flip-flop 300 has an asynchronous, positive-logic reset input terminal R for input of a reset signal RST output from the AND gate 301, which has positive- and negative-logic input terminals. The positive-logic input terminal of the AND gate 301 receives logic output data LO from the combinatorial circuit 310; the negative-logic input terminal receives the output signal ORO of the OR gate 302.

The OR gate 302 externally receives a test data input signal TDI and the scan shift enable signal SCAN_SE. The test data input signal TDI is received from an external test data input terminal, also denoted TDI. This input terminal TDI and the signal line connecting it to the OR gate 302 constitute a mask control circuit.

Next, an example of a scan test circuit including the circuit in FIG. 9 will be described with reference to FIG. 10. The scan test circuit 30 includes the flip-flop 300, AND gate 301, combinatorial circuit 310, OR gate 302, additional flip-flops 320 and 330, and buffers 311 and 312.

The scan shift enable input terminal SE of flip-flop 300 receives the scan shift enable signal SCAN_SE from an external source. The scan data input terminal SI of flip-flop 300 receives scan data SI from the output terminal of flip-flop 320, so that in a scan sequence, scan data are shifted from flip-flop 320 to flip-flop 300. The data input terminal DI of flip-flop 300 receives data DI from buffer 311, which amplifies the data output from flip-flop 320. The output terminal Q of flip-flop 300 is connected to the scan data input terminal of another scan flip-flop (not shown) so that the data DO output from flip-flop 300 can be scanned out by the clock signal CLK during a scan test.

The asynchronous reset input terminal of flip-flop 300 is connected directly to the output terminal of the AND gate 301. A reset occurs when the reset signal RST goes high, that is, when the output signal LO of the combinatorial circuit 310 is at the high logic level and the output signal ORO of the OR gate 302 is at the low logic level.

The OR gate 302 receives the test data input signal TDI and the scan shift enable signal SCAN_SE from external sources. The OR gate 302 modifies the scan shift enable signal SCAN_SE according to the test data input signal TDI and thereby masks the reset signal RST when either SCAN_SE or TDI is high.

Figure 10:
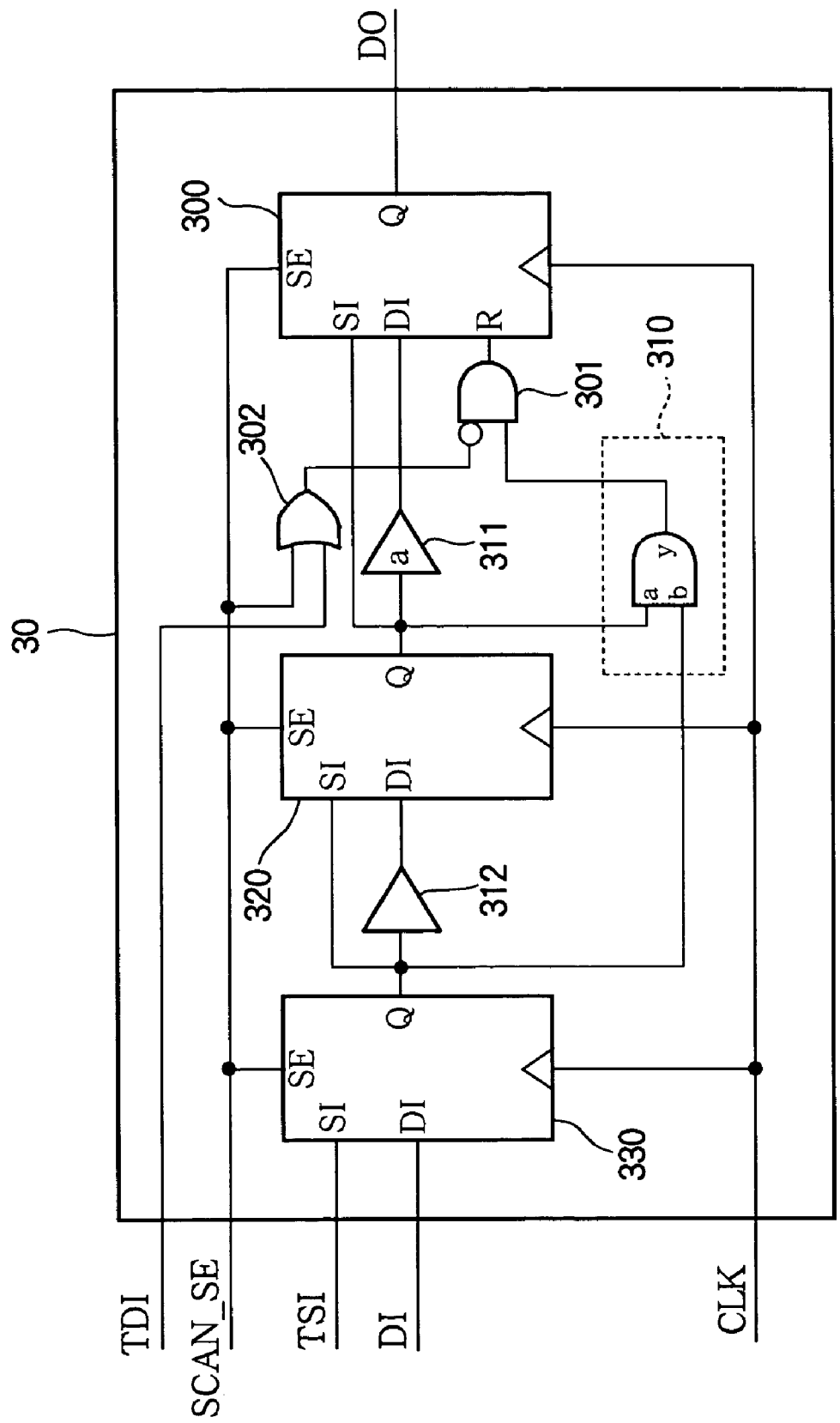
FIG. 10 is a circuit diagram showing an example of the overall structure of the scan test circuit according to the third embodiment.

The combinatorial circuit 310 in FIG. 10 is an AND gate that receives the output signals of flip-flops 320 and 330. The combinatorial circuit is not limited to the AND-gate configuration shown in FIG. 10, but this configuration will be assumed in the following description. If the output signal of flip-flop 320 (the input signal to buffer 311) is denoted a, the output signal of flip-flop 330 is denoted b, and the output signal of this AND gate is denoted y, then when the scan shift enable signal goes low (SCAN_SE=0) after completion of a scan sequence, the testability of buffer 311 for a stuck-at-0 (SA0) fault is related to signals a, b, and y, the output signal ORO of the OR gate 302, and the reset signal RST as indicated in FIG. 7 in the second embodiment.

Like the second embodiment, the third embodiment provides a masking function that can prevent the resetting of flip-flop 300 regardless of the state of the combinatorial circuit 310, thereby providing an increased versatility that enables an ATPG tool to shorten test times by compressing test patterns. Differing from the second embodiment, the third embodiment uses an external test data input signal (TDI) to control the mask function.

Figure 11:
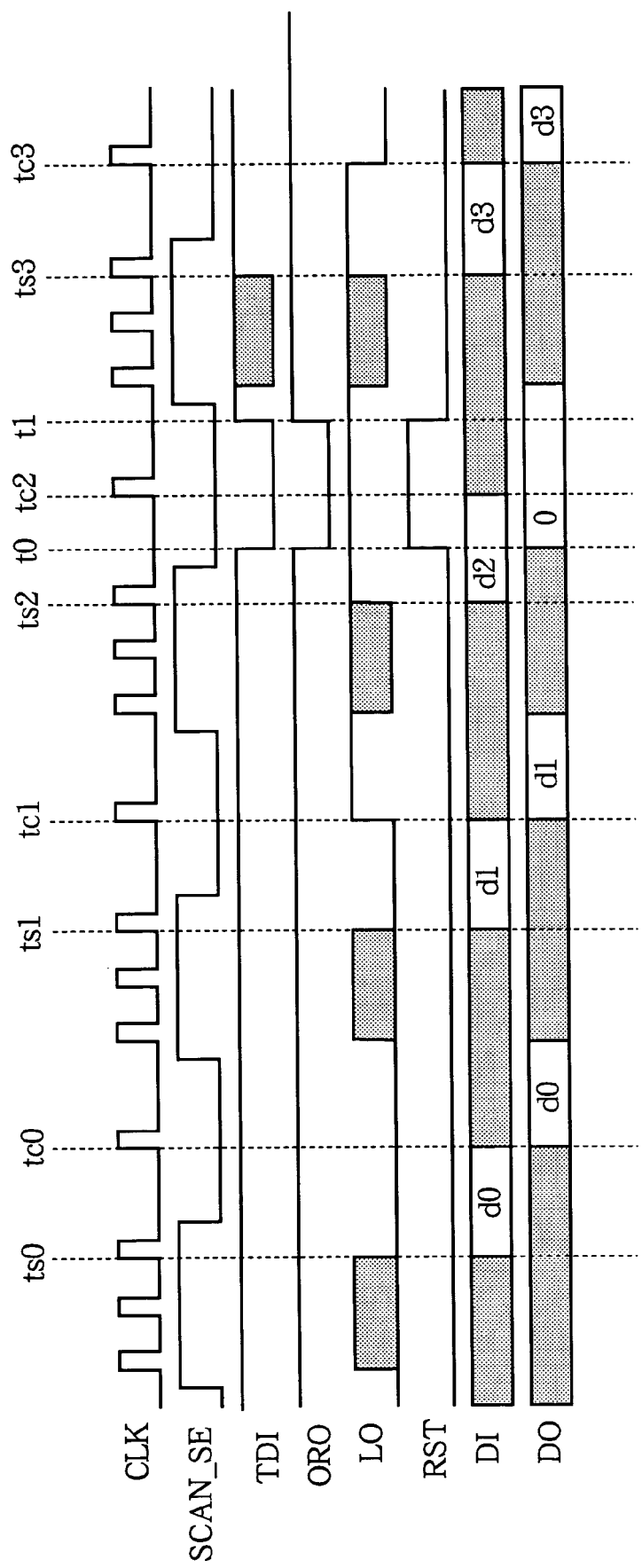
FIG. 11 is a timing waveform diagram illustrating the operation of the third embodiment.

Next, the operation of the scan test circuit 30 in FIG. 10 will be described with reference to the timing diagram in FIG. 11, which uses the signal names shown in FIG. 9. The illustrated scan test sequence is the same as in the first and second embodiments. The clock signal CLK, scan shift enable signal SCAN_SE, and the output LO of the combinatorial circuit 310 have the same waveforms as in the first and second embodiments.

The waveform of the reset signal RST and the data DI and DO input to and output from flip-flop 300 at timings ts0, tc0, ts1, tc1, ts3, and tc3 are the same as in the second embodiment. In the second embodiment, the data SFFO scanned into flip-flop 203 controlled the reset input signal RST input to flip-flop 200 so that it could be enabled and disabled during the capture sequence. In the third embodiment, this control function is carried out by the external test data input signal TDI.

The test data scanned in are designed so that the output LO of the combinatorial circuit 310 goes high and the external test data input signal TDI is kept high at the rising edge of the clock signal CLK at timing ts2. Following timing ts2, after the scan shift enable signal SCAN_SE goes low to start the capture sequence, the external test data input signal TDI is driven low at an arbitrary timing to, causing the output ORO of the OR gate 302 to go low at this point. Since the output LO of the combinatorial circuit 310 is high, the reset signal RST output from the AND gate 301 goes high, resetting the flip-flop 300.

The external test data input signal TDI is driven high at an arbitrary timing t1 after the capture timing tc2, while the scan shift enable signal SCAN_SE is low. The output ORO of the OR gate 302 therefore goes high at this point. Since the output LO of the combinatorial circuit 310 is high, the reset signal RST output from the AND gate 301 goes low, ending the resetting of the flip-flop 300.

As in the second embodiment, the asynchronous reset signal is kept inactive during the period while the scan shift enable signal SCAN_SE is high during each scan shift sequence, so that scan shifting can be performed without resetting the shifted data, and the asynchronous reset signal can be manipulated in various ways by the output LO of the combinatorial circuit 310 while the scan shift enable signal SCAN_SE is low to test of the reset/nonreset state of flip-flop 300. These manipulations can be masked, however, by the external test data input signal TDI in order to test buffer 311, as in the capture sequences at timings tc1 and tc3 in FIG. 11.

As described above, the addition of the AND gate 301, OR gate 302, and test data input terminal TDI enables the reset function of flip-flop 300 to be tested, as well as enabling the reset signal to be masked for testing of the circuitry connected to the data input terminal of flip-flop 300. Specifically, the asynchronous reset signal can be enabled or masked by the external test data input signal TDI. The scan test circuitry size can accordingly be reduced, and since scan testing controllability is improved, the necessary number of test patterns can be reduced. Moreover, since the test data input terminal TDI can be controlled at an arbitrary timing, timing design is simplified.

All three of the preceding embodiments have a simple reset control circuit (an AND gate) that can disable an unwanted asynchronous reset signal during a scan shift sequence and enable the asynchronous reset signal during a scan capture sequence without the need for extra scan test pins for input of signals such as a scan test mode signal or an external reset signal. Thus, the integrated circuit being tested requires fewer pins than would be necessary for a conventional scan test circuit including a flip-flop with an asynchronous reset terminal, and fault coverage by scan testing can be improved by testing the asynchronous reset function at a reduced cost in terms of scan test circuitry size.

If the scan test circuit also includes a mask circuit such as the OR gate in the second and third embodiments for disabling the reset signal during the scan capture sequence, scan testing controllability is improved, and the necessary number of test patterns can be reduced.

If the mask circuit is controlled from a test data input terminal as in the third embodiment, the asynchronous reset signal can be enabled and disabled at arbitrary timings during the scan capture sequence, so timing design is simplified.

The present invention is not limited to the embodiments described above. A few of the many possible modifications and variations are as follows.

While a flip-flop circuit with an asynchronous reset input terminal was employed in the embodiments described above, a flip-flop with an asynchronous set input terminal can be employed instead. The term 'reset signal' should be understood to cover any signal that forces the output of a flip-flop to a predetermined state, regardless of its present internal state or present data input.

The reset signal may be either active high or active low.

The invention is not limited to the AND gates and OR gates shown in the above embodiments. Other logic circuits, generating equivalent logic relationships, may be employed instead.

Those skilled in the art will recognize that still further variations are possible within the scope of the invention, which is defined by the appended claims.

What is claimed is:

1. A scan test circuit incorporated into an integrated circuit, the scan test circuit comprising:
    a first flip-flop having a reset input terminal for input of a reset signal, the first flip-flop also receiving a data signal, a scan data signal, and a scan shift enable signal, selecting the data signal or the scan data signal according to the scan shift enable signal, and providing the selected signal as output data; and
    a reset control circuit for controlling the reset signal according to the scan shift enable signal.

2. The scan test circuit of claim 1, wherein the reset control circuit controls the reset signal so that the reset signal is enabled only while the scan shift enable signal selects the data signal.

3. The scan test circuit of claim 1, wherein the reset control circuit comprises a logic gate receiving the scan shift enable signal and a reset control signal output from a combinatorial circuit in the integrated circuit.

4. The scan test circuit of claim 3, wherein the reset control circuit inverts the scan shift enable signal and ANDs the inverted scan shift enable signal with the reset control signal.

5. The scan test circuit of claim 4, wherein the combinatorial circuit comprises an AND gate receiving output signals of second and third flip-flops, the second and third flip-flops forming a scan chain together with the first flip-flop.

6. The scan test circuit of claim 1, further comprising:
    a mask circuit for masking the reset signal; and
    a mask control circuit for controlling the mask circuit.

7. The scan test circuit of claim 6, wherein the mask circuit comprises a logic gate for modifying the scan shift enable signal according to an output signal from the mask control circuit and supplying the modified scan shift enable signal to the reset control circuit.

8. The scan test circuit of claim 6, wherein the logic gate in the mask circuit is an OR gate receiving the scan shift enable signal and the output signal from the mask control circuit.

9. The scan test circuit of claim 6, wherein the mask control circuit comprises a flip-flop into which arbitrary data can be loaded.

10. The scan test circuit of claim 6, wherein the mask control circuit comprises:
    an input terminal for input of arbitrary data; and
    a signal line for supplying the arbitrary data to the mask circuit.

* * * * *